United States Patent [19]
Matsumoto et al.

[11] 3,886,458
[45] May 27, 1975

[54] FREQUENCY CONVERTER CIRCUIT WITH INTEGRATED INJECTION CAPACITOR

[75] Inventors: Shigeo Matsumoto, Sagamihara, Kanagawa-ken; Yukio Tsuda, Atsugi, Kanagawa-ken; Tadaharu Tsuyuki, Isehara, Kanagawa-ken, all of Japan

[73] Assignee: Sony Corporation, Tokyo, Japan

[22] Filed: Dec. 6, 1973

[21] Appl. No.: 422,131

[30] Foreign Application Priority Data

Dec. 12, 1972 Japan .............................. 47-142880

[52] U.S. Cl. .................. 325/439; 321/60; 325/445; 330/38 M; 357/14; 357/23; 357/48; 357/51

[51] Int. Cl. .............................................. H04b 1/28

[58] Field of Search ........... 325/430, 438, 439, 442, 325/445; 317/101 A, 234 UA; 321/60; 330/38 M

[56] References Cited

UNITED STATES PATENTS 3,641,441 2/1972 Gunn et al. ........................ 325/430

OTHER PUBLICATIONS

"Parasitics In Integrated Circuits," H. K. Dicken, Motorola Semiconductor Products Inc., Phoenix, Ariz., July, 1963, p. 32–36.

"A Broader Choice of Components for Silicon Integrated Circuits," Robert M. Burger & Robert P. Donovan, Solid State Lab. Research Triangle Institute, Durham, N.C., May, 1965, p. 48–59.

"G. E. Transistor Manual," Seventh Edition, 1969, Chap. 12, p. 293, FIG. 12.17.

"Integrated Circuits For Television Receivers," Eizi Sugata & Toshihiko Namekawa, Osaka Univ., IEEE Spectrum, May, 1969, p. 64–73, e.g. FIG. 1.

*Primary Examiner*—Howard W. Britton
*Assistant Examiner*—Marc E. Bookbinder
*Attorney, Agent, or Firm*—Lewis H. Eslinger; Alvin Sinderbrand

[57] ABSTRACT

In a signal converter circuit having a mixer circuit with an input terminal for receiving radio frequency (RF) signals and locally oscillated signals, by way of an injection or coupling capacitor, from the output of a local oscillator circuit, such injection or coupling capacitor is formed between a pair of terminals of a capacitor element provided on a semiconductor substrate on which at least portions of the mixer and local oscillator circuits are also formed, and the capacitor element is connected with the mixer and local oscillator circuits so that the stray capacitor appearing between one of the capacitor element terminals and the substrate is at the mixer circuit side of injection capacitor rather than at the local oscillator side of the latter.

5 Claims, 7 Drawing Figures

FREQUENCY CONVERTER CIRCUIT WITH INTEGRATED INJECTION CAPACITOR

BACKGROUND OF THE INVENTION

1. Field of the Invention

This invention relates generally to a signal converter circuit and more particularly is directed to an integrated signal converter circuit which is formed on a single semiconductor wafer or substrate.

2. Description of the Prior Art

In television receivers, for example, many circuits, such as, intermediate frequency (IF) amplifiers, luminance amplifiers, chrominance amplifiers, audio circuits, and the like have been devices to be formed as an integrated circuit on a single semiconductor wafer or substrate, either alone or together with other circuits. However, in the use of converter circuits including a mixer and a local oscillator, as is usually provided in a tuner, little or no progress has been made in forming such a circuit as an integrated circuit.

One of the main reasons for the foregoing is the fact that a converter circuit usually includes a number of capacitors and inductors which it is difficult to make as parts of an integrated circuit. Further, signal loss through an injection or coupling capacitor from the local oscillator to the mixer is very large and the operation of the local oscillator is deteriorated by the capacitor when the capacitor is also formed together with other circuits on the same semiconductor wafer or substrate.

SUMMARY OF THE INVENTION

It is an object of this invention to provide an improved signal converter circuit which is formed as an integrated circuit on a single semiconductor wafer or substrate.

It is another object of this invention to provide an integrated signal converter circuit which is formed on a single semiconductor wafer or substrate together with an injection or coupling capacitor passing a signal from a local oscillator to a mixer, and in which signal loss through the injection or coupling capacitor is minimized.

It is a further object of this invention to provide an integrated signal converter circuit which is formed on a single semiconductor wafer or substrate together with an injection or coupling capacitor passing a signal from a local oscillator to a mixer, and in which the operation of the local oscillator is not undesirably influenced or deteriorated by the coupling capacitor.

In accordance with an aspect of this invention, the injection or coupling capacitor through which the locally oscillated signals are supplied from a local oscillator circuit to the input terminal of a mixer circuit which also receives the radio frequency signals is constituted by the main capacitor formed between two terminals of a capacitor element provided on a semiconductor substrate on which at least portions of the mixer and local oscillator circuits are preferably also provided, and the connections of such capacitor element with the mixer and local oscillator circuits are arranged so that a stray capacitor formed between one of the terminals of the capacitor element and the semiconductor substrate is at the mixer side of the injection or coupling capacitor, whereby the operation of the local oscillator circuit is not deleteriously affected by the stray capacitor and the signal injection efficiency to the mixer circuit is increased.

The above, and other objects, features and advantages of the invention will be apparent in the following detailed description of illustrative embodiments thereof which is to be read in connection with the accompanying drawings.

DESCRIPTION OF THE PREFERRED EMBODIMENTS

Figure 1:
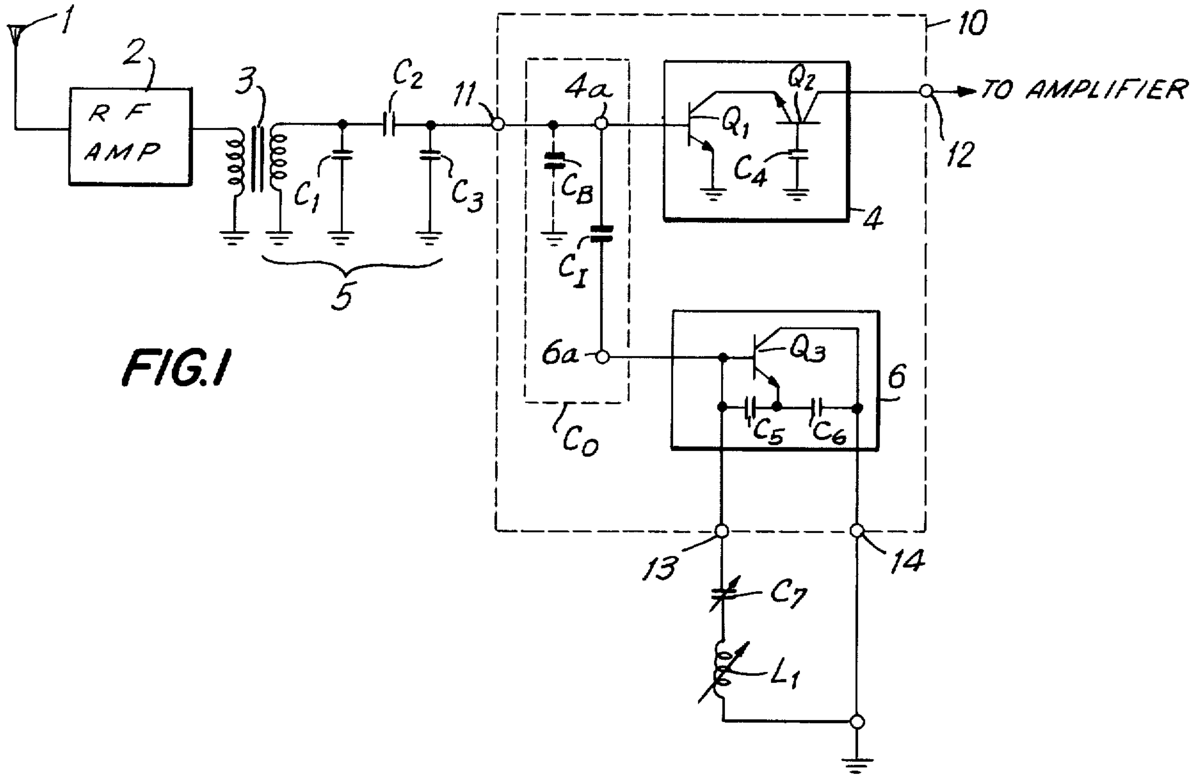
FIG. 1 is a circuit diagram showing the principal components of a signal converter according to the present invention.

Referring first to FIG. 1, it will be seen that the signal input section of a receiver is shown to include an antenna 1 connected to a radio frequency (RF) amplifier 2. The output of RF amplifier 2 is connected to the primary winding of a transformer 3 and the secondary winding of transformer 3 is connected through a group of capacitors $C_1$–$C_3$ to an input terminal 4*a* of a mixer circuit 4. The secondary winding of transformer 3 and the group of capacitors $C_1$–$C_3$ together form a resonance circuit 5 for introducing a selected one of the received signals to input terminal 4*a* of mixer circuit 4.

An output terminal 6*a* of a local oscillator circuit 6 is connected to input terminal 4*a* of mixer circuit 4 through a capacitor element $C_0$ which provides an injection or coupling capacitor $C_1$ and a stray capacitor $C_B$. The stray capacitor $C_B$ is peculiar to capacitor element $C_0$, as will be explained in detail hereinafter.

The capacitor element $C_0$ and at least portions of the mixer circuit 4 and local oscillator circuit 6 are formed on a single semiconductor wafer as an integrated circuit identified by the reference numeral 10. Such integrated circuit 10 is shown to have an external terminal 11 for receiving RF signals, an external terminal 12 for deriving output signals from mixer circuit 4, and external terminals 13 and 14 for connection to elements controlling the frequency of local oscillator 6.

The mixer circuit 4 is shown on FIG. 1 to be fundamentally constituted by a pair of transistors $Q_1$ and $Q_2$ connected in cascade with a capacitor $C_4$ being provided to make transistor $Q_2$ operate as a grounded-base amplifier.

The local oscillator 6 is shown to be formed as a well known Colpitts type oscillator, in which a capacitor $C_5$ is connected between the base and emitter electrodes of a main transistor $Q_3$, a capacitor $C_6$ is connected between the emitter and collector electrodes of transistor $Q_3$, and a series connected L-C circuit, shown on FIG. 1 to be made up of a variable capacitor $C_7$ and a variable inductor $L_1$, is connected by way of terminals 13 and 14 between the base and collector electrodes of the transistor $Q_3$. The overall impedance of the series L-C circuit is inductive and the frequency of local oscillator 6 is controlled by adjusting either variable capacitor $C_7$ or variable inductance $L_1$ for changing the overall inductance therebetween.

In FIG. 1, only fundamental circuit elements of mixer circuit 4 and local oscillator circuit 6 are shown to illustrate AC equivalent circuits thereof, and detail circuit configurations of circuits 4 and 6 will be described hereinafter in connection with FIG. 5.

In the operation of the circuit shown on FIG. 1, the input signals introduced to the antenna 1 are selectively amplified by RF amplifier 2 and supplied to the input terminal 4*a* of mixer circuit 4 through transformer 3 and the group of capacitors $C_1$–$C_3$, while the locally oscillated signals are also supplied from local oscillator 6 to mixer circuit 4 through the injection capacitor $C_1$ of capacitor element $C_0$ and the input terminal 4*a*.

The frequencies of the RF signals and the locally oscillated signals are selected in respect to each other by a channel selector (not shown) so that the frequency of the output signals from the output terminal 12 of the mixer circuit 4 is maintained constant and coincides with a so-called intermediate frequency.

The present invention is particularly concerned with the formation of capacitor element $C_0$ and the manner in which it is connected between local oscillator circuit 6 and mixer circuit 4 in an integrated circuit arrangement.

In order to promote easy understanding of the present invention, different types of capacitors formed on a semiconductor wafer or substrate will now be described in connection with FIGS. 2 and 3.

Figure 2:
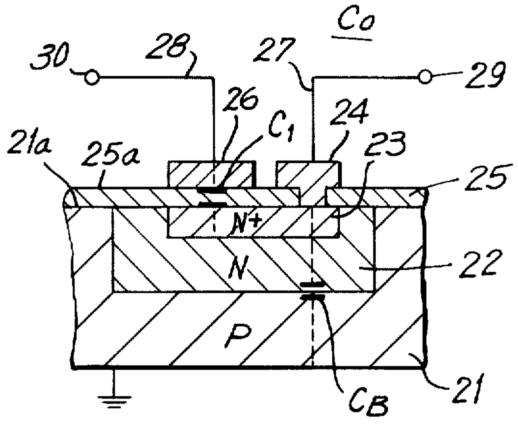
FIG. 2 is a cross sectional view of one example of a capacitor element included in the signal converter circuit of FIG. 1.

On FIG. 2, there is shown, in an enlarged and exaggerated form, a cross-sectional view of a so-called MOS (metal oxide silicon) type capacitor element $C_0$. The capacitor element $C_0$ of FIG. 2 includes a semiconductor substrate 21 of P-type conductivity having an N-type semiconductive region 22 diffused into one surface 21*a* of the substrate 21. A higly doped $N^+$-type region 23 is formed in N-type region 22 and an electrode 24 is ohmically contacted with $N^+$-type region 23. An insulation layer 25 is formed on surface 21*a* of substrate 21 and another electrode 26 is provided on a surface 25*a* of insulation layer 25 which covers $N^+$-type region 23. A pair of leads 27 and 28 extend from electrodes 24 and 26, respectively, to a pair of terminals 29 and 30. With the foregoing construction, a main capacitor $C_1$ is obtained between electrodes 24 and 26 or between terminals 29 and 30, while a stray capacitor $C_B$ is essentially formed between electrode 24 and substrate 21.

Figure 3:
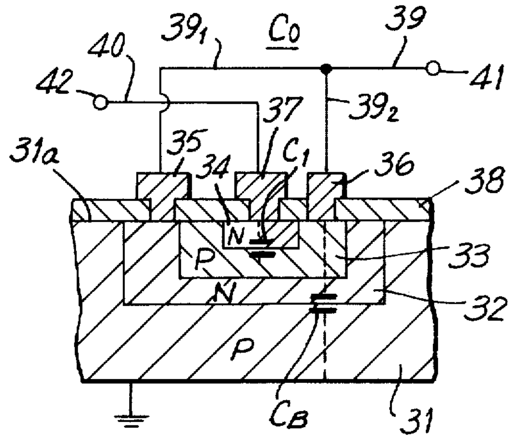
FIG. 3 is a cross sectional view of another example of a capacitor element included in the signal converter circuit of FIG. 1.

Referring now to FIG. 3, it will be seen that, in another type of capacitor element $C_0$ formed on a semiconductive substrate 31, such substrate is of P-type conductivity and an N-type region 32 is diffused into one surface 31*a* of substrate 31. A P-type region 33 is formed in N-type region 32 and an N-type region 34 is formed in P-type region 33. Three electrodes 35,36 and 37 are ohmically contacted with the regions 32,33 and 34, respectively, and surface 31*a* of substrate 31 is covered by an insulation layer 38. Three leads $39_1$,$39_2$ and 40 are connected to electrodes 35,36 and 37, respectively, and the leads $39_1$ and $39_2$ are connected together to a lead 39 extending to a terminal 41 while the lead 40 extends to a terminal 42. With the construction of FIG. 3, a main capacitor $C_1$ is obtained between terminals 41 and 42 when the PN junction between P-type region 33 and N-type region 34 is reverse biased and this type of capacitor is usually called a PN junction type capacitor, while a stray capacitor $C_B$ is essentially formed between terminal 41 and substrate 31.

Figure 4:
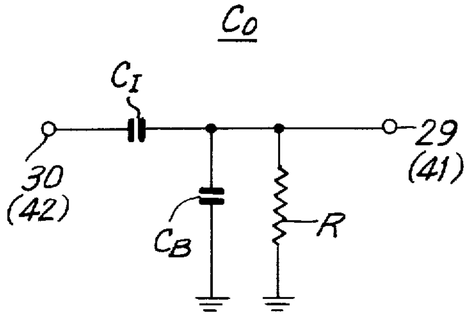
FIG. 4 is a schematic circuit equivalent of the capacitor elements shown in FIGS. 2 and 3.

Referring now to FIG. 4, it will be seen that an equivalent circuit is there shown for the MOS type capacitor element of FIG. 2, when seen from the terminals 29 and 30, or for the PN junction type capacitor element of FIG. 3, when seen from the terminals 41 and 42. In the case of the MOS or PN junction type of capacitor element, there exists essentially a stray capacitor $C_B$ between one terminal 29 or 41 of the main capacitor $C_1$ and the substrate which is to be grounded. The equivalent circuit includes a resistor R in parallel with the stray capacitor $C_B$, but this resistor is large enough to be neglected. The terminal 29 or 41 can be preselected or distinguished from the other terminal 30 or 42 according to the structure of the capacitor of FIG. 2 on FIG. 3. Actually the capacitance value of the stray capacitor $C_B$ is relatively high, for example, it may be of the order of 3–5 picofarads when the capacitor $C_1$ is of the order of 3 picofarads.

Referring again to FIG. 1, it will be seen that capacitor $C_1$ of capacitor element $C_0$ is used as an injection capacitor for coupling local oscillator circuit 6 to mixer circuit 4, and, in accordance with this invention, capacitor element $C_0$ is connected to circuits 4 and 6 so that the terminal 29 or 41 is connected to the input terminal 4*a* of mixer circuit 4 and the other terminal 30 or 42 is connected to the output terminal 6*a* of local oscillator circuit 6, whereby the stray capacitor $C_B$ is at the mixer side of the injection capacitor and not at the oscillator side thereof.

By connecting the capacitor element $C_0$ as described above according to this invention, the following advantages are obtained:

1. The efficiency of the signal injection from local oscillator circuit 6 to mixer circuit 4 can be maintained high, as the stray capacitor $C_B$ does not appear at the oscillator side of the injection capacitor $C_1$ in which case it would shunt a large amount of the signals from local oscillator 6.

2. The frequency control of local oscillator circuit 6 by means of variable capacitor $C_7$ or variable inductor $L_1$ is much less influenced or deterioratd by stray capacitor $C_B$ than would be the case if the stray capacitor $C_B$ appeared at the oscillator side and was connected in parallel with capacitor $C_7$ and inductor $L_1$.

3. The stray capacitor $C_B$ assists resonant circuit 5, because capacitor $C_B$ is additively inserted in parallel with capacitor $C_3$, and therefore capacitor $C_3$ can be of reduced capacitance value.

Figure 5:
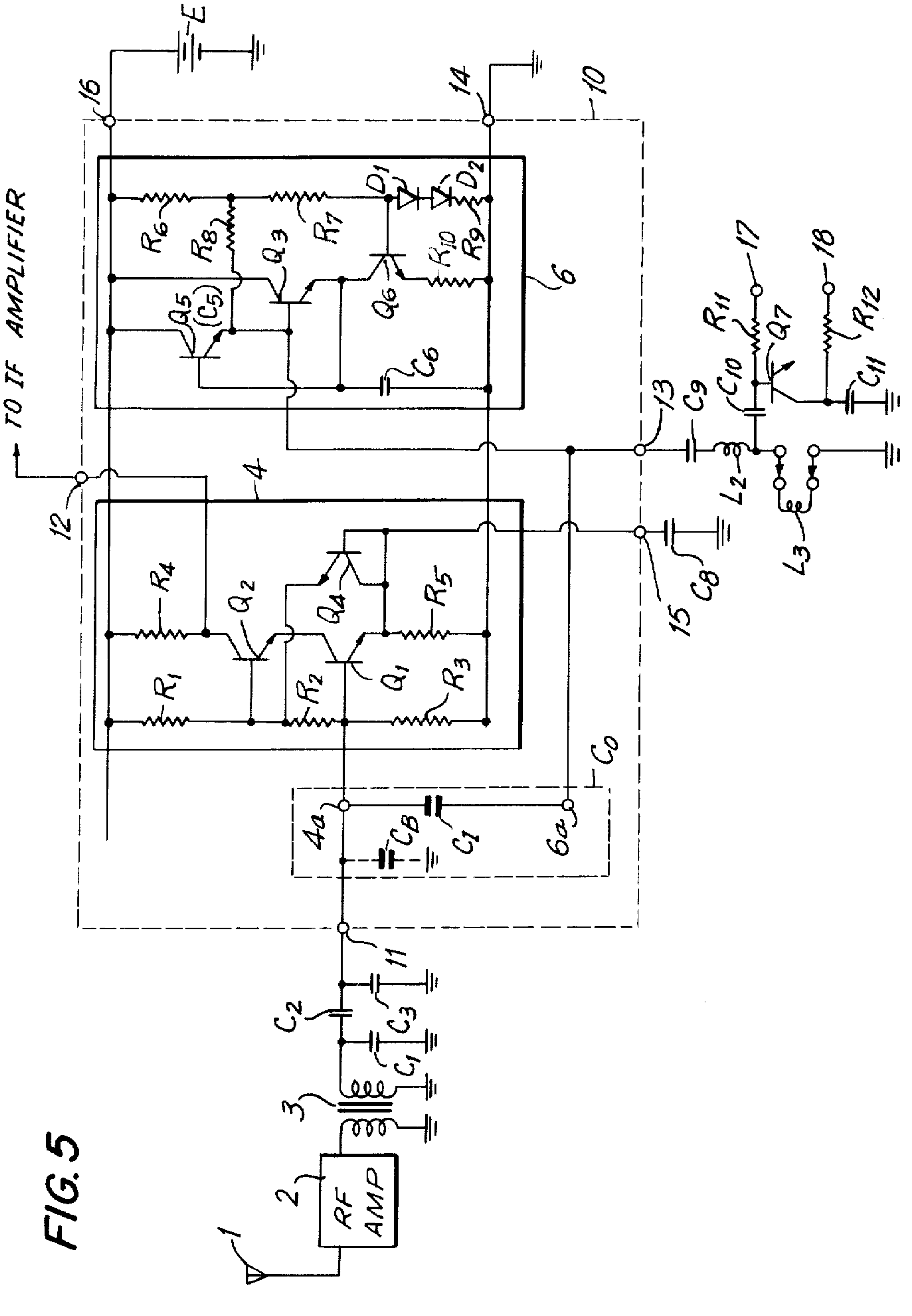
FIG. 5 is a more detailed circuit diagram of one example of a signal converter circuit according to the present invention.

Referring now to FIG. 5, in which elements corresponding to those described above with reference to FIG. 1 are identified by the same reference numerals, it will be seen that, in a practical example of the circuit shown on FIG. 1, the mixer circuit 4 includes biasing resistors $R_1$,$R_2$,$R_3$,$R_4$ and $R_5$ for the cascade connected transistors $Q_1$ and $Q_2$, and a DC voltage source E is connected to an external terminal 16 provided on the integrated circuit 10. In the mixer circuit 4 on FIG. 5, the PN junction between the base and emitter electrodes of a transistor $Q_4$ is reverse biased and forms a part of the capacitor $C_4$ of FIG. 1 for connecting the base electrode of transistor $Q_2$ to the emitter electrode of transistor $Q_1$. An external terminal 15 on the integrated circuit 10 is connected to the emitter electrode of transistor $Q_1$, and a capacitor $C_8$ is connected between terminal 15 and ground, whereby the emitter electrode of transistor $Q_1$ is grounded relative to alternating current. The base electrode of the transistor $Q_2$ is also grounded relative to alternate current by means of the capacitor formed by transistor $Q_4$ and capacitor $C_8$.

The local oscillator circuit 6 of FIG. 5 is shown to include the main transistor $Q_3$ mentioned in connection with the circuit of FIG. 1, and a transistor $Q_5$ having the PN junction between its base and emitter electrodes reverse biased to form the capacitor $C_5$ of FIG. 1 which is connected between the base and emitter electrode of transistor $Q_3$. The capacitor $C_6$, which is formed, for example, as a MOS type capacitor, is connected between the emitter electrode of transistor $Q_3$ and the ground, as on FIG. 1.

A transistor $Q_6$ is also provided in the circuit 6 on FIG. 5 and forms a constant current biasing circuit for transistor $Q_3$. Resistors $R_6$,$R_7$,$R_8$,$R_9$ and $R_{10}$ and diodes $D_1$ and $D_2$ are also provided on FIG. 5 as biasing circuit elements for the transistors $Q_3$, $Q_5$ and $Q_6$.

The L-C circuit for controlling the frequency of local oscillator 6 in the detail circuit of FIG. 5 comprises a capacitor $C_9$ and an inductor $L_2$ connected in series with a selectively changeable inductor $L_3$, for example, in response to actuation of a channel selector control, between the terminal 13 and ground. Further a series circuit of a capacitor $C_{10}$, the base-collector path of a transistor $Q_7$ and a capacitor $C_{11}$ is connected from a junction between inductors $L_2$ and $L_3$ to ground. Since the emitter electrode of transistor $Q_7$ is open, the PN junction between the base and collector electrodes of that transistor forms a variable capacitance the value of which is determined by the DC voltage applied between the base and collector electrodes of transistor $Q_7$ through decoupling resistors $R_{11}$ and $R_{12}$ and which is controlled by a control voltage applied to terminals 17 and 18 from a so-called fine-tuning circuit (not shown). The L-C circuit represented simply on FIG. 1 by the variable capacitor $C_7$ and the variable inductor $L_1$ is the equivalent of the corresponding circuit of FIG. 5 as to alternating current.

It will be seen that, in the circuit arrangement of FIG. 5, the capacitor element $C_o$ is connected between output terminal 6*a* of local oscillator 6 and input terminal 4*a* of mixer circuit 4 so that, in accordance with the invention, the stray capacitor $C_B$ appears at the mixer side of the main or injection capacitor $C_1$.

Figure 6:
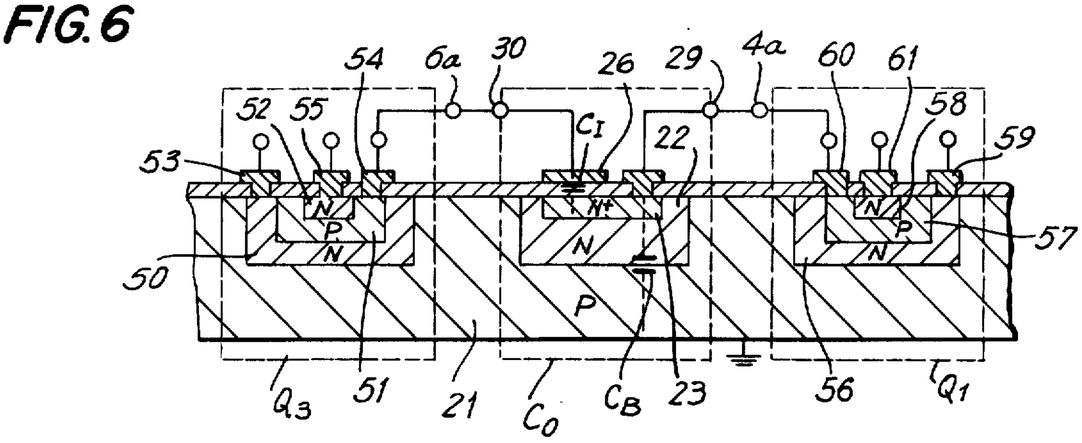
FIG. 6 is a cross-sectional view of one example of an integrated circuit forming a portion of the circuit shown in FIG. 5, and in which the capacitor element shown in FIG. 2 is used.

Referring now to FIG. 6, in which the construction and connection of the capacitor element $C_o$ between the transistor $Q_1$ of the mixer circuit 4 and the transistor $Q_3$ of the local oscillator circuit 6 of FIG. 5 are illustrated for the case where the capacitor element $C_o$ is formed as an MOS type capacitor as on FIG. 2, it will be seen that the various elements on FIG. 6 are identified by the same reference numerals as are applied to the corresponding elements on FIGS. 2 and 5. The transistor $Q_3$ of the local oscillator circuit 6 is shown on FIG. 6 as an NPN transistor formed on a semiconductor substrate 21 and having collector, base and emitter regions 50,51 and 52 which are respectively ohmically contacted by electrodes 53, 54 and 55. The transistor $Q_1$ of the mixer circuit 4 is an NPN transistor also formed on the semiconductive substrate 21 and having collector, base and emitter regions 56,57 and 58 which are respectively ohmically contacted by electrodes 59,60 and 61. The capacitor element $C_o$, as shown on FIG. 2, is also formed on substrate 21 and has its terminal 29 connected to the base electrode 60 of transistor $Q_1$ through the input terminal 4*a* of mixer circuit 4, while the other terminal 30 of the capacitor element is connected to the base electrode 54 of transistor $Q_3$ through the output terminal 6*a* of local oscillator circuit 6. It will be apparent from FIG. 6 that, in the integrated circuit arrangement there shown, the stray capacitor $C_B$ is at the side of the main or injection capacitor $C_I$ toward transistor $Q_1$ of the mixer circuit and not at the side toward the transistor $Q_3$ of the local oscillator circuit.

Figure 7:
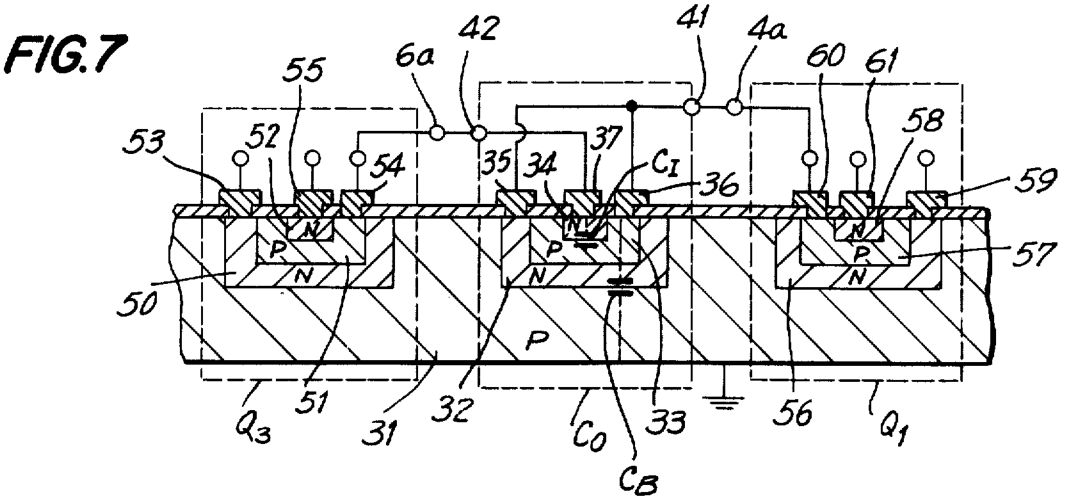
FIG. 7 is a view similar to that of FIG. 6, but in which the capacitor element of FIG. 3 is used.

Referring now to FIG. 7, which shows the construction and connection of the capacitor $C_o$ between the transistor $Q_1$ of mixer circuit 4 and the transistor $Q_3$ of local oscillator circuit 6 of FIG. 5 when the capacitor element $C_o$ is formed as a PN junction type capacitor as shown on FIG. 3, it will be seen that the transistors $Q_1$ and $Q_3$ are similar to those described above with reference to FIG. 6 and have their parts identified by the same reference numerals, and that the parts of the capacitor element $C_o$ are identified by the same reference numerals used for the corresponding parts on FIG. 3. In the integrated circuit arrangement of FIG. 7, the transistors $Q_1$ and $Q_3$ and the capacitor element $C_o$ are formed on the same semiconductor substrate 31 and the terminal 41 of capacitor element $C_o$ is connected to the base electrode 60 of transistor $Q_1$ through the input terminal 4*a* of mixer circuit 4, while the other terminal 42 of capacitor element $C_o$ is connected to the base electrode 54 of transistor $Q_3$ through the output terminal 6*a* of local oscillator circuit 6. In this case, the DC potential at the base electrode 60 of transistor $Q_1$ is made lower than that at the base electrode 54 of transistor $Q_3$ in order to reverse bias the PN junction between the regions 33 and 34 of capacitor element $C_o$ by suitably selecting the resistance values of the resistors $R_1$–$R_{10}$ on FIG. 5. In the integrated circuit arrangement of FIG. 7, as before, the stray capacitor $C_B$ of the PN junction type capacitor is at the side of the main or injection capacitor $C_I$ toward transistor $Q_1$ of the mixer circuit and not at the side toward transistor $Q_3$ of the local oscillator circuit.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A signal converter circuit comprising a mixer circuit having input and output terminals, means for supplying input signals to be converted to said input terminal of the mixer circuit, a local oscillator circuit having an output terminal, a capacitor element formed on a semiconductor substrate and having first and second terminals, said capacitor element providing a main capacitor between said first and second terminals and a stray capacitor between said first terminal and said semiconductor substrate, and means connecting said first and second terminals of the capacitor element to said input terminal of the mixer circuit and to said output terminal of the local oscillator circuit, respectively, so that said main capacitor functions as an injection capacitor for the output of said local oscillator circuit with said stray capacitor being at the side of said injection capacitor toward said mixer circuit.

2. A signal converter circuit according to claim 1, wherein at least a portion of said mixer circuit and a portion of said local oscillator circuit are formed on said semiconductor substrate with said capacitor element.

3. A signal converter circuit according to claim 2, wherein said capacitor element is of the MOS type.

4. A signal converter circuit according to claim 2, wherein said capacitor element is of the PN junction type.

5. A signal converter circuit according to claim 1, wherein said means for supplying input signals to said input terminal of the mixer circuit includes a resonant circuit having at least one capacitor in parallel with said stray capacitor.

* * * * *